(12) United States Patent
Burr

(10) Patent No.: US 7,462,858 B2
(45) Date of Patent: Dec. 9, 2008

(54) FABRICATION OF PHASE CHANGE MEMORY ELEMENT WITH PHASE-CHANGE ELECTRODES USING CONFORMAL DEPOSITION

(75) Inventor: Geoffrey W. Burr, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/668,224

(22) Filed: Jan. 29, 2007

(65) Prior Publication Data

US 2008/0179583 A1 Jul. 31, 2008

(51) Int. Cl.
*H01L 29/04* (2006.01)

(52) U.S. Cl. .................. 257/3; 257/4; 257/296; 257/774; 257/E27.004; 257/E45.002; 438/95; 438/637

(58) Field of Classification Search .................. None
See application file for complete search history.

(56) References Cited

U.S. PATENT DOCUMENTS

| | | | |
|---|---|---|---|
| 4,630,355 A | 12/1986 | Johnson | |
| 4,845,533 A | 7/1989 | Pryor et al. | |
| 6,839,263 B2 | 1/2005 | Fricke et al. | |
| 6,869,883 B2 | 3/2005 | Chiang et al. | |
| 2004/0134975 A1 | 7/2004 | Goenka et al. | |
| 2004/0256694 A1 | 12/2004 | Kostylev et al. | |
| 2005/0167645 A1 | 8/2005 | Kim et al. | |
| 2005/0194620 A1 | 9/2005 | Dennison et al. | |
| 2005/0199420 A1 | 9/2005 | Ishimaru et al. | |
| 2006/0001016 A1 | 1/2006 | Dennison | |
| 2007/0097739 A1* | 5/2007 | Happ et al. | 365/163 |
| 2007/0121374 A1* | 5/2007 | Lung et al. | 365/163 |

* cited by examiner

*Primary Examiner*—A. Sefer
*Assistant Examiner*—Scott R Wilson
(74) *Attorney, Agent, or Firm*—Cantor Colburn LLP; Daniel E. Johnson

(57) ABSTRACT

A phase change memory element with phase change electrodes, and method of making the same. Exemplary embodiments include a phase change bridge, including a bottom contact layer, a first insulating layer disposed on the bottom contact layer, a first phase change region disposed on the bottom contact layer adjacent the first insulating layer, a second phase change region disposed on the bottom contact layer adjacent the first insulating layer, wherein the first insulating layer thermally and electrically isolates the first and second phase change regions, and a third phase change region disposed on each of the first and second phase change regions, each of the third phase change regions isolated from one another by a conductor layer disposed on the first insulating layer.

8 Claims, 11 Drawing Sheets

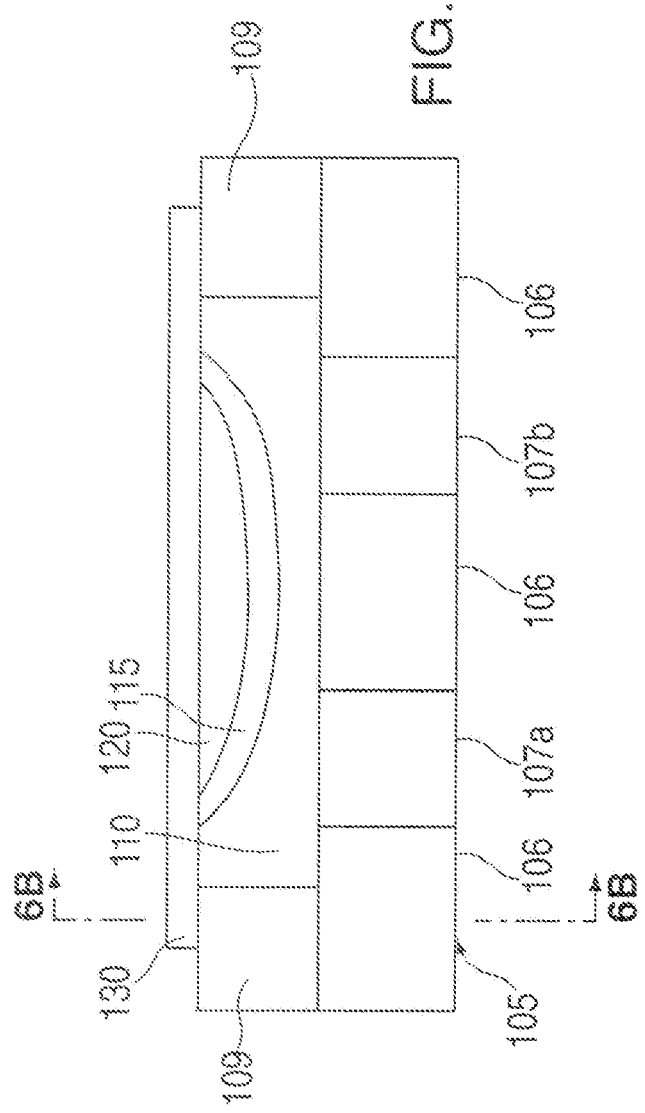
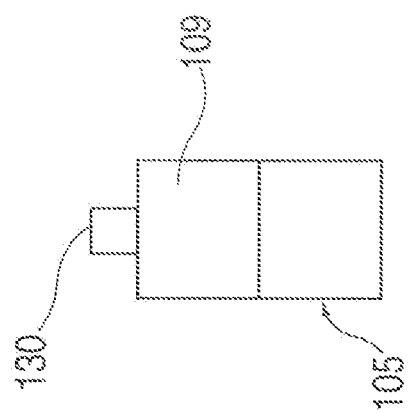

FABRICATION OF PHASE CHANGE MEMORY ELEMENT WITH PHASE-CHANGE ELECTRODES USING CONFORMAL DEPOSITION

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates generally to thin-film phase-change memories, and more particularly to a phase change memory element with phase change electrodes, and method of making the same.

2. Description of Background

Phase-change memory devices use phase-change materials, i.e., materials that may be electrically switched between a generally amorphous and a generally crystalline state, as an electronic memory. One type of memory element utilizes a phase-change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase-change materials is also non-volatile. When the memory is set in either a crystalline, semi-crystalline, amorphous, or semi-amorphous state representing a resistance or threshold voltage ($V_1$) value, that value is retained until reprogrammed, even if power is removed. The value is retained because the programmed value represents a phase or physical state of the material (e.g., crystalline or amorphous).

Typically, one of the limiting factors in the density with which such a non-volatile memory can be fabricated is not the size of the programmable phase-change element, but instead the size of the access transistor or other access device co-located with each phase-change memory element. This feature stems from the scaling of the maximum current supplied by the access device with its size, and thus memory element designs that can reduce the amount of current required (or somewhat equivalently, the total power required) in order to switch the phase-change element are key for this technology. Particularly critical is the highest current (power) that is needed to melt the phase-change material during the programming of the high-resistance "RESET" state. In the RESET state, the current path through the phase-change element upon readout is forced to pass through some portion of the phase-change material that is in the amorphous phase, thus leading to high device resistance.

Two paths towards reducing this RESET current are to reduce the cross-sectional volume (or more appropriately, area) of the device that is switched between crystalline and amorphous, and to increase the thermal efficiency, so that most of the electrical power that is injected into the device goes towards melting the phase-change material. Key to this second point is the need to increase the thermal resistance between the switching volume and its surroundings. And in particular, the electrodes that deliver current to the device need to have high thermal resistance yet low electrical resistance (because if they were highly resistive, then they themselves would heat up instead of the switching volume).

Thus, there is a need for cell designs which combine small switching volume together with electrodes that have a high thermal resistance yet a low electrical resistance.

There remains a need for a method of fabricating a structure with electrodes that have high thermal resistance, as opposed to thermally conducting metallic electrodes.

SUMMARY OF THE INVENTION

Exemplary embodiments include a phase change bridge, including a bottom contact layer, a first insulating layer disposed on the bottom contact layer, a first conductive region disposed on the bottom contact layer adjacent the first insulating layer, a second conductive region disposed on the bottom contact layer adjacent the first insulating layer, wherein the first insulating layer thermally and electrically isolates the first and second conductive regions, and a phase change region disposed on each of the first and second conductive regions, each of the phase change regions isolated from one another by a conductor layer disposed on the first insulating layer.

Further exemplary embodiments include a phase change bridge fabrication method, including depositing in sequential order a first layer of phase change material over a bottom conduct layer having at least one bottom electrical contact, an insulating layer, and a second layer of phase change material, the first phase change material having a resistance and the second phase change material having a resistance, forming a surface including a portion of the first and second layers of phase change material and a portion of the insulating layer, depositing a third layer of phase change material over the surface, the third layer of phase change material having a resistance greater than the resistance of the first and second phase change materials and forming a top electrical contact over said surface electrically coupling to the second low resistance PCM layer.

Additional exemplary embodiments include a phase change memory element, including a first layer of phase change material over a bottom contact layer having at least one bottom electrical contact, an insulating layer, and a second layer of phase change material, the first phase change material having a resistance and the second phase change material having a resistance, a third layer of phase change material bridging the first and second phase change material layers over the insulating layer, thereby forming a phase change bridge, the third layer of phase change material having a resistance greater than the resistance of the first and second phase change materials and a top contact coupled to the second phase change material layer, whereby a current path is defined from the bottom contact layer up to the first phase change material layer, across the third phase change material layer, over the insulating layer, down to second phase change material layer and up through the top electrical contact.

Additional features and advantages are realized through the techniques of the present invention. Other embodiments and aspects of the invention are described in detail herein and are considered a part of the claimed invention. For a better understanding of the invention with advantages and features, refer to the description and to the drawings.

DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 6A illustrates an intermediate structure during the fabrication process of FIG. 2 in accordance with exemplary embodiments;

FIG. 6B illustrates an intermediate structure during the fabrication process of FIG. 2 in accordance with exemplary embodiments:

The detailed description explains the preferred embodiments of the invention, together with advantages and features, by way of example with reference to the drawings.

DETAILED DESCRIPTION OF THE INVENTION

Exemplary embodiments include a phase change bridge (PCB) and a fabrication procedure for the same, producing a phase-change bridge-type memory element, in which the electrodes have high thermal resistance. In particular, the fabrication procedure forms the three underlayers (two electrodes and insulator between them) in one step, so as to avoid the need for multiple space steps to create and planarize these underlayers. The electrodes can be composed of phase-change material that has been deposited and/or doped in order to have low resistance, whereas the bridge connecting the electrodes is composed of phase-change material that has been deposited and/or doped in order to have high resistance.

Figure 1:
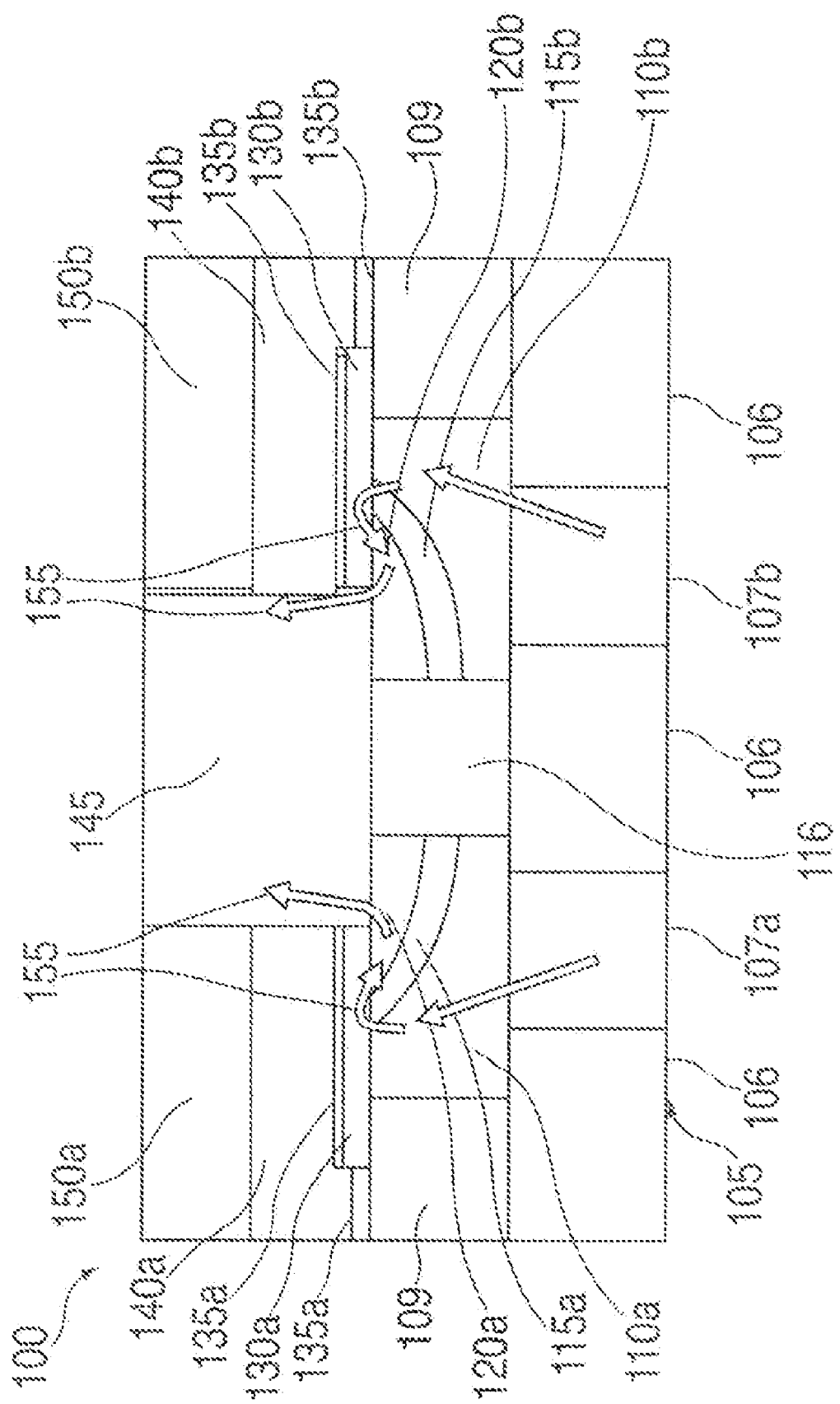
FIG. 1 illustrates a cross-sectional view of an exemplary phase change bridge (PCB)

FIG. 1 illustrates a cross-sectional view of an exemplary phase change bridge (PCB) 100. The fabrication steps of PCB 100 are discussed in the description below with respect to FIGS. 2-11. In exemplary embodiments, PCB 100 includes bottom contact 105 layer, which can be an oxide layer 106, with metal vias 107 defined therein. Metal vias 107 can be a variety of materials, such as but not limited to titanium nitride (TiN), tungsten (W), etc. It is understood that there are a variety of materials, preferably conductive, which can be implemented to form bottom contact layer 105. It is further understood that bottom contact 105 is coupled to or is for coupling to a transistor (e.g., coupled to a transistor drain). Therefore, access transistors or other devices have been already fabricated on a silicon or SOI wafer at a desired eventual memory pitch (e.g., 20-50 nm). Furthermore, metallic vias (electrodes) 107 are formed leading down to, for instance, the drain of each access transistor.

PCB 100 further includes a hard layer 109, such as silicon nitride (SiN) disposed on bottom contact 105 having vias opened (discussed further in the description below) to expose the bottom contacts for either two neighboring cells along some memory array direction X (horizontal dimension in FIG. 1), or for four neighboring cells arranged in a "plus" sign for memory array directions X and Y (where X is the horizontal direction in FIG. 1, and Y is the out-of-plane dimension).

PCB 100 further includes a first low-resistance phase-change (and conductive) material layer 110a, 110b is formed on bottom contact 105. In general, the phase change material can include but is not limited to chalcogenide, etc. An insulator layer 115a, 115b, such as, but not limited to, silicon dioxide ($SiO_2$), silicon oxygen nitride (SiON), silicon nitride (SiN), etc., is formed. Insulator layer 115a, 115b is a good electrically and thermally insulating dielectric material. A second low-resistance phase-change (and conductive) material layer 120a, 120b is formed on insulator layer 115a, 115b. Layer 115a, 115b can be, for example, <10 nm thick. In an exemplary implementation, the materials used for layers 110a, 110b, 120a, 120b are defined by having high thermal resistance and low electrical resistance. The resistivity of layers 110, 120 may be advantageously chosen such that they contribute <20% of the total cell resistance of the memory device. For instance, for a target resistance of the device in the SET state of 10 kOhm, the total resistance through layers 110,120 (for the current path shown in FIG. 1 which leads from 107a to 145) should be preferably less than 2 kOhms. In an alternative embodiment, layers 110, 120 can be composed of a material that does not exhibit a phase-change effect so long as the material exhibits high electrical conductivity and low thermal conductivity. Adhesion of these layers to each other and to the underlayers 106,107a,107b,109 during the planarization process is considered in selecting materials for layers 110a, 110b, 115a, 115b, 120a, 120b. Unless otherwise discussed, layer 110a, 110b is discussed collectively as layer 110, layer 115a, 115b is discussed collectively as layer 115, layer 120a, 120b is discussed collectively as layer 120 and layer 107a, 107b is discussed collectively as layer 107. An additional insulating layer 116 is formed over bottom contact 105 and disposed between a first low-resistance phase change region, defined by layers 110a, 115a, 120a, and a second low-resistance phase change region defined by layers 110b, 115b, 120b. Insulating layer 116 electrically and thermally isolates the first and second low resistance phase change regions. Layer 116 generally exhibits a phase-change effect, and its resistivity is chosen such that in the crystalline phase this layer contributes >80% of the device resistance.

A high-resistance phase-change layer 130a, 130b (collectively layer 130) is formed over both the first and second low resistance phase change regions and a protective layer 135a, 135b (collectively protective layer 135) is formed over the first and second low resistance phase change regions and layer 130. Protective layer 135 can be SiN, or other suitable material.

Referring still to FIG. 1, top contact 145 is formed over insulating layer 116 and a portion of layer 120. Fop contact 145 is thereby electrically coupled to layer 120. PCB 100 further includes an insulating layer 140a, 140b (collectively layer 140) formed over layer 135. Layer 140 can be a dielectric material having a low dielectric constant K and low thermal conductivity such as $SiO_2$. A top protective layer 150a, 150b (collectively 150), such as but not limited to SiN, can be formed adjacent contact 145 and on insulating layer 140.

Further structural and functional features are discussed in the description below with respect to fabrication of PCB 100.

In general, in PCB 100, a current 155 has a flow path defined through metallic electrode 107, first low-resistance phase change layer 110, through high resistance phase change layer 130, through second phase change layer 120 and top contact 145. Layer 130 contacts the two layers 110, 120 by bridging the insulating layer 115, and defines the phase change region through layer 130. Therefore, the region defined by layer 130 is a phase change junction switch through which the current 155 flowing through PCB 100 undergoes a small phase change. Because layers 110,120 have been chosen to have high electrical conductivity, much of the electrical energy (IV power) is dissipated within layer 130, and in particular at the intersections between layer 115 and layers 110,120. But because layers 110,120 have been chosen to have low thermal conductivity, the injected heat remains in the vicinity of the switching junction, thus allowing the device to reach the melting point and be quenched to the amorphous phase with less injected current (power) than would otherwise be required.

Figure 2:
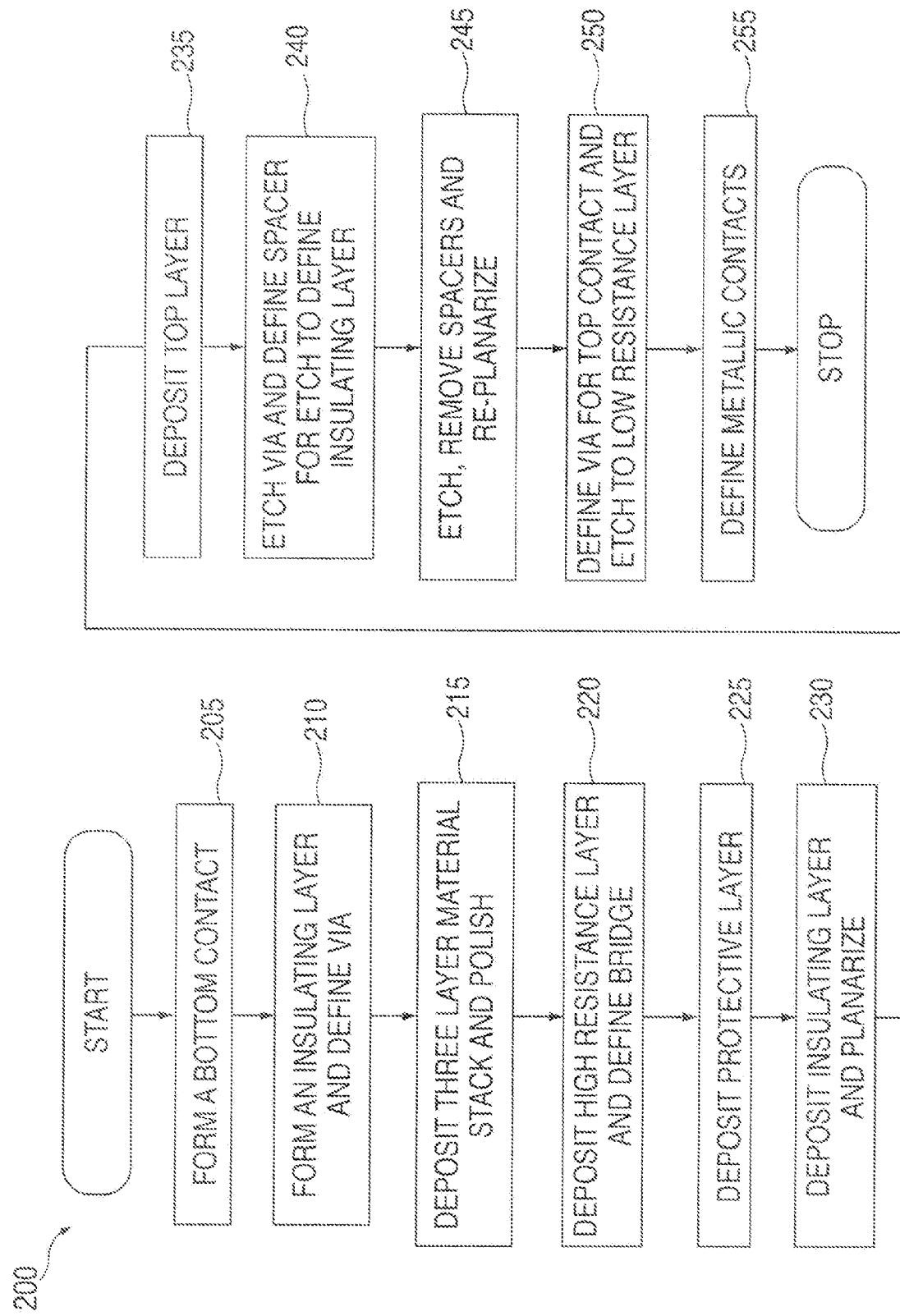
FIG. 2 illustrates a fabrication process in accordance with exemplary embodiments.

FIG. 2 illustrates a fabrication process 200 in accordance with exemplary embodiments. As discussed above, access transistors or other suitable devices are coupled to bottom contact layer 105. At step 205 bottom contact layer 105 is formed having an insulating (e.g., oxide) layer 106 with metallic electrodes 107 defined therein as discussed below for coupling to access transistors.

Figure 3:
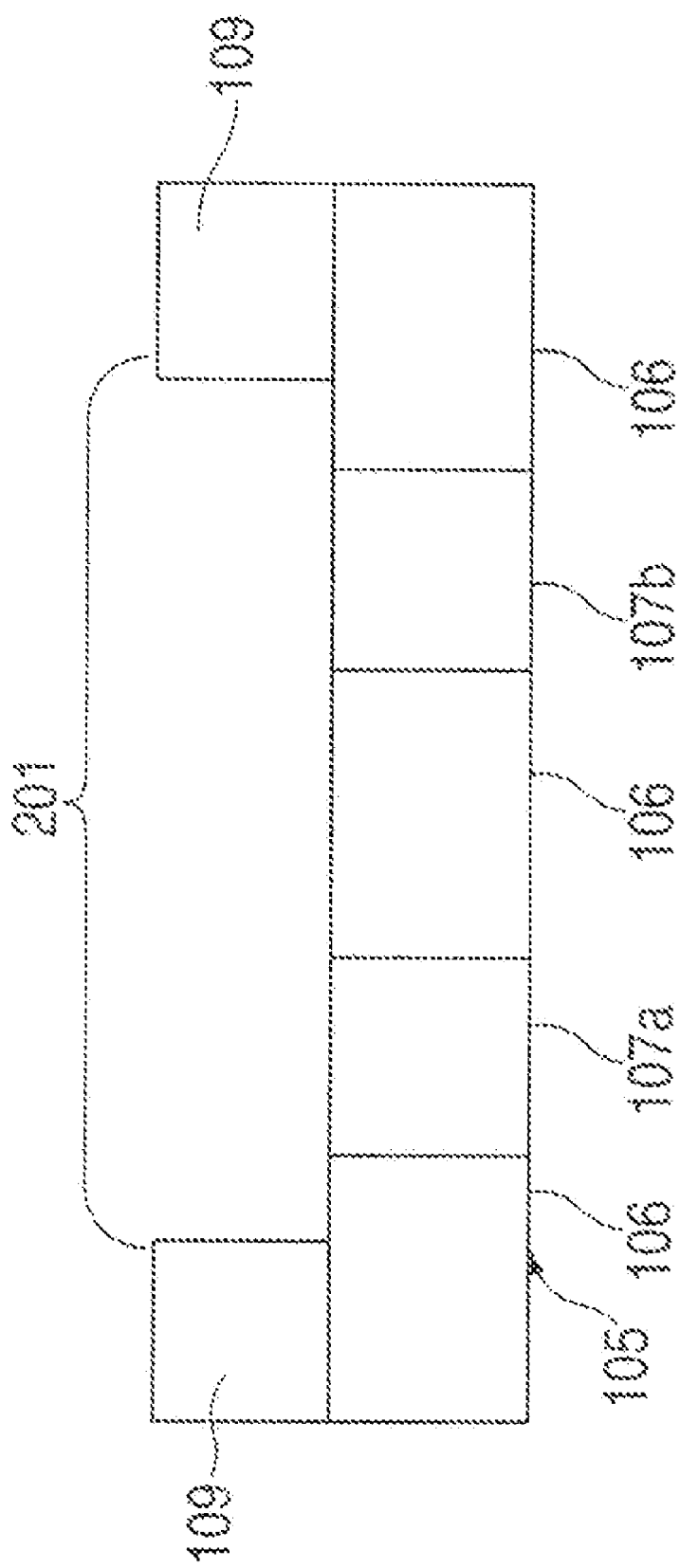
FIG. 3 illustrates an intermediate structure during the fabrication process of FIG. 2 in accordance with exemplary embodiments.

At step 210, a hard, protective, layer 109 such as SiN is deposited on the bottom layer 105 for electrical contact with the metallic electrodes 107. This layer exhibits have excellent adhesion both to the bottom layer 105 as well as to the subsequent layer 110, and must be chosen such that the subsequent planarization step (such as chemical-mechanical polishing) will remove layers 110,115,120 but will not be able to remove very much of layer 109. An etch is performed to define a large via 201 opening in the hard layer 109. FIG. 3 illustrates an intermediate structure in accordance with step 210 of process 200. As discussed above, hard layer 109 is deposited and vias 201 opened to expose the metallic electrodes 107 for either two neighboring cells along some memory array direction X, or for four neighboring cells arranged in a "plus" sign for memory array directions X and Y.

Figure 4:
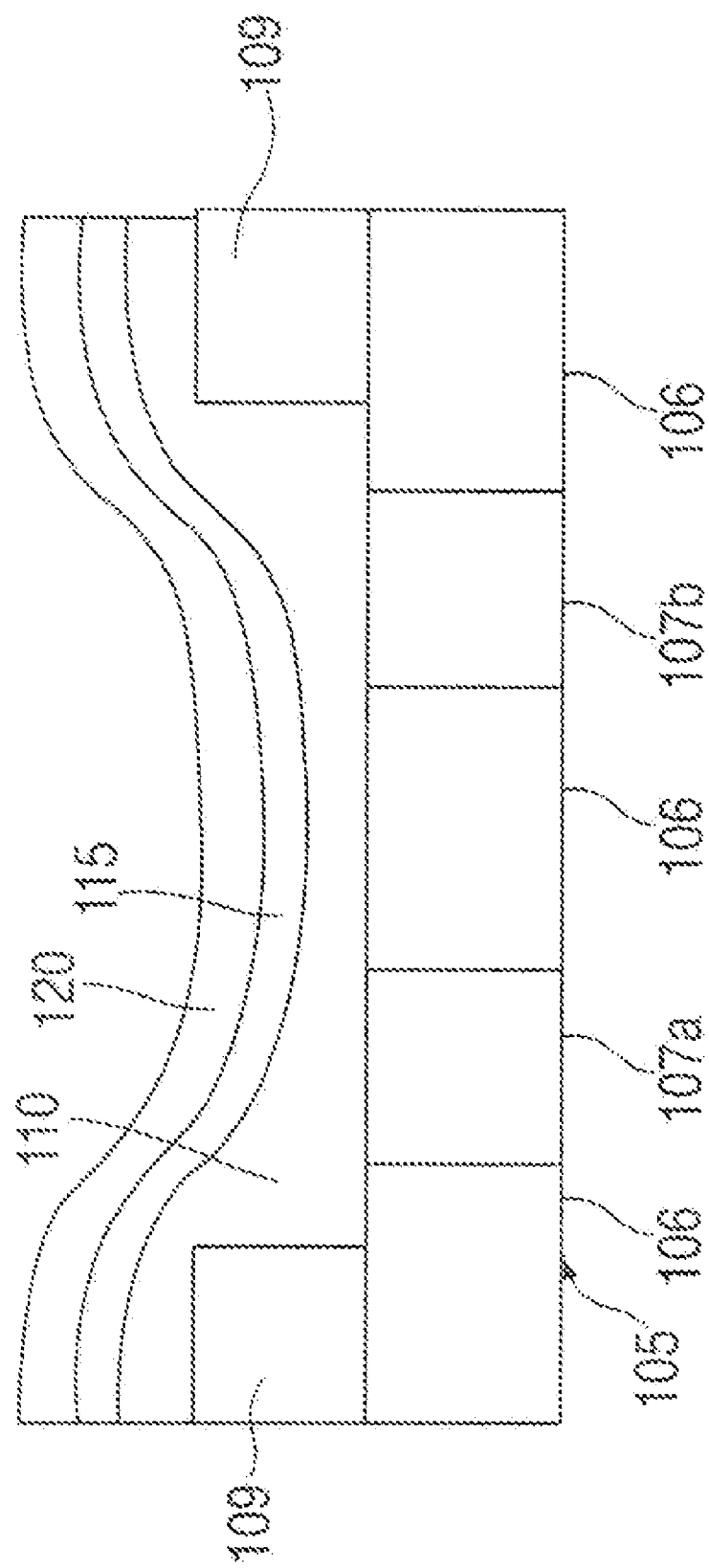
FIG. 4 illustrates an intermediate structure during the fabrication process of FIG. 2 in accordance with exemplary embodiments.

At step 215, a three layer material stack is deposited. The three layer material stack includes the first and second low resistance layers 110, 120 as well as the insulating layer 115, disposed therebetween, the layers being present in the ultimate PCB (See FIG. 1). FIG. 4 illustrates an intermediate structure in accordance with step 215 of process 200. In general, the height and aspect ratio of the via 201 of step 120 is chosen so as to enable the conformal deposition of the three-layer stack of materials into the via 201. As discussed, layers 110, 120 are a low-resistance phase-change material and layer 115 is a thin insulating layer such as silicon oxide. In an exemplary implementation, low resistance phase change layers 110, 120 are a material with high thermal resistance and low electrical resistance, and the insulating layer 115 is a good electrical and thermal insulator.

The thickness of first low resistance layer 110 is chosen (for example, between 10 and 40 nm thick) in order to place the average height of the second low resistance phase change layer 120. Second low resistance phase change layer 120 is formed higher than the top of the hard layer 109 (SiN) in a region defined above hard layer 109 that remains after the etch to open via 201 at step 210. Furthermore, first low resistance phase change layer 120 is formed lower than the top of this SiN layer 109 within the vias 201 defined between the hard layers 109 (e.g., first low resistance phase change layer 110 can be defined between 5 and 30 nm thick). In an exemplary implementation, layers 110, 115, 120 are formed conformally (e.g., deposited, sputtered, etc.) and can either be a gentle sinusoidal as illustrated, or a nearly square-wave shape which closely follows the underlying SiN topology. It is appreciated that there are a variety of accepted ways in which the three layer stack can be formed such that a slice along the top of the SiN regions exposes all three of these layers in a controllable and repeatable fashion.

Figure 5:
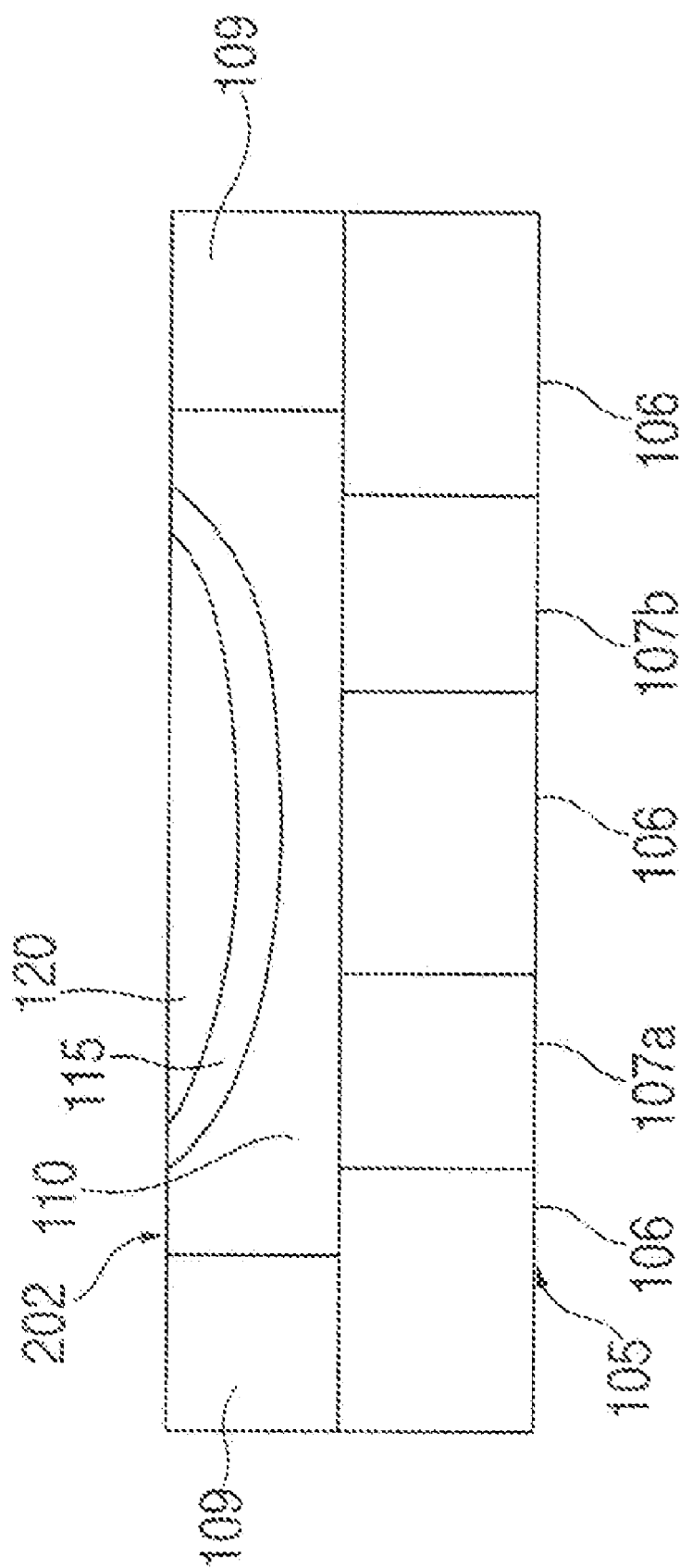
FIG. 5 illustrates an intermediate structure during the fabrication process of FIG. 2 in accordance with exemplary embodiments.

Continuing with step 215, the three layer stack is sliced and polished. FIG. 5 illustrates an intermediate structure in accordance with step 215 of process 200 and illustrates the result of this slicing procedure, which can be performed by chemical-mechanical polishing of the substrate down to the hard SiN regions. The layer thicknesses and SiN height of hard layer 109 are chosen such that three layers, that is, the underlying low resistance layer 110 (as an ultimate electrode), the insulating layer 115 and the now isolated bowl of electrode material, that is, second low resistance layer 120 lying above insulating layer 115, are exposed on the polished surface 202.

At step 220, third phase change material layer 130 is deposited on polished surface 202. As discussed above, third phase change material layer 130 has a resistance greater than the first and second phase change material layers 110, 120. Third phase change material layer 130 is subsequently defined into a bridge that is narrow with respect to the PCB 100. FIG. 6A illustrates an intermediate structure in accordance with step 220 of process 200. FIG. 6A illustrates that the layer 130 is formed on hard layers 109 and along the exposed layers 110, 115, 120. FIG. 6B illustrates a cross section view of the intermediate structure of FIG. 6A illustrating the narrow width of the bridge layer 130 with respect to the overall intermediate structure. As disclosed in the prior art, it is preferable that both the width and the thickness of bridge layer 130 be as small as possible while maintaining repeatability of this cross-sectional area (width times thickness) from device to device. The deposition of high resistance phase-change material followed by the etching of all of this layer except along a thin line, bridges the first low resistance layer 110 to the second low resistance layer 120 across insulating layer 115. The definition of this line of layer 130 can either be done directly with photolithography or through a spacer process, in which a space is formed on the edge of a lithographically defined block followed by the removal of the block, leaving only the thin spacer. This spacer is then used to protect the narrow line of phase-change material from a subsequent etch.

At step 225, protective layer 135 is deposited over layer 130 and the remaining exposed polished surface 202. In general, the formation of layer 135, which can be SiN, makes subsequent etch steps easier because layer 135 can be used as an etch stop layer during formation of the contact 116. Layer 135 also helps to protect the sensitive junction region layer 130 during these subsequent processing steps.

In general, the remainder of fabrication process 200 includes isolating the two (or four, in X&Y) devices defined by the two phase change regions (discussed with respect to FIG. 1) that are shorted together via the underlying electrode layer 110. Further, process 200 includes making unique electrical contact to the top electrode of phase change material layer 120.

Figure 7:
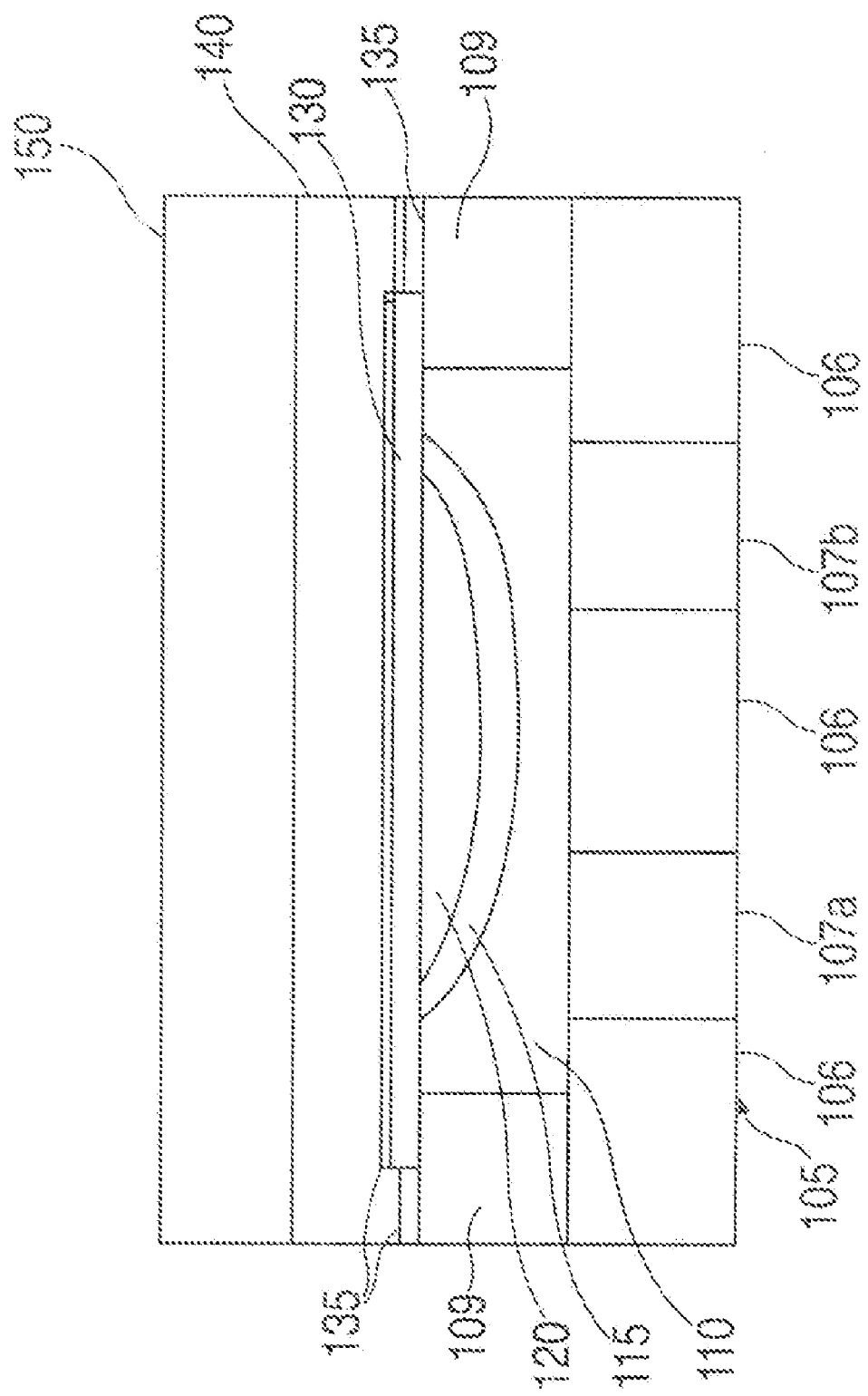
FIG. 7 illustrates an intermediate structure during the fabrication process of FIG. 2 in accordance with exemplary embodiments.

At step 230, an insulating layer 140 is deposited on protective layer 135 that covers the phase-change bridges (layer 130). The deposited insulating layer 140 is planarized, and at step 235 the top layer 150 is deposited. Top layer 150 can be SiN. FIG. 7 illustrates an intermediate structure in accordance with steps 225, 230, 235 of process 200. FIG. 7 illustrates protective layer 135, insulating layer 140 and top layer 150, as discussed.

Figure 8:
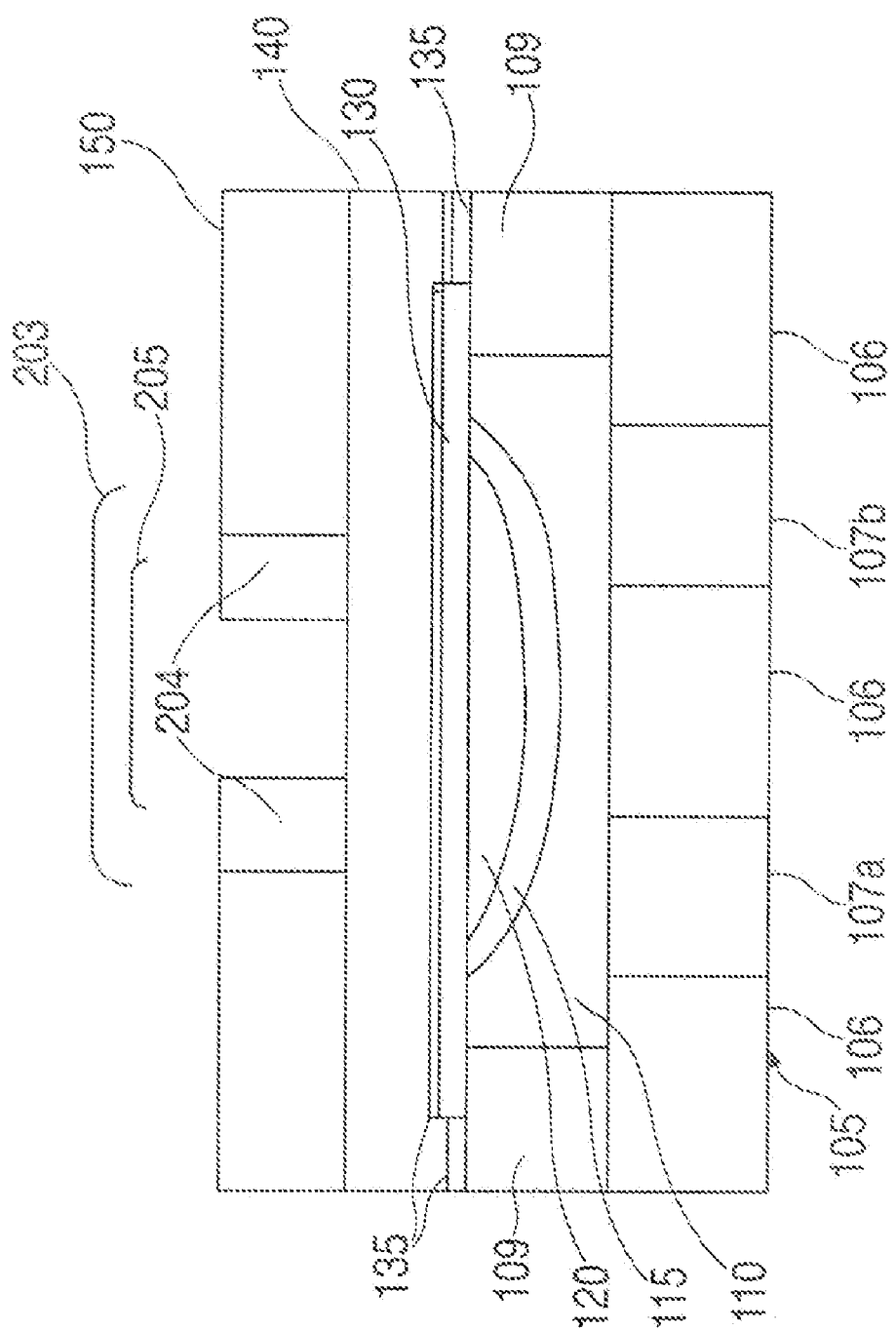
FIG. 8 illustrates an intermediate structure during the fabrication process of FIG. 2 in accordance with exemplary embodiments.

At step 240, a via 203 is defined and located between the underlying metal electrodes (layers 107a, 107b) that are, at this instant, shorted together by layer 110. To setup a further step, the size of via 203 is reduced slightly by forming a spacer 204 or different material (e.g., poly-silicon, etc.) within via 203 to define via 205, which is narrower than via 203. FIG. 8 illustrates an intermediate structure in accordance with step 240.

Figure 9:
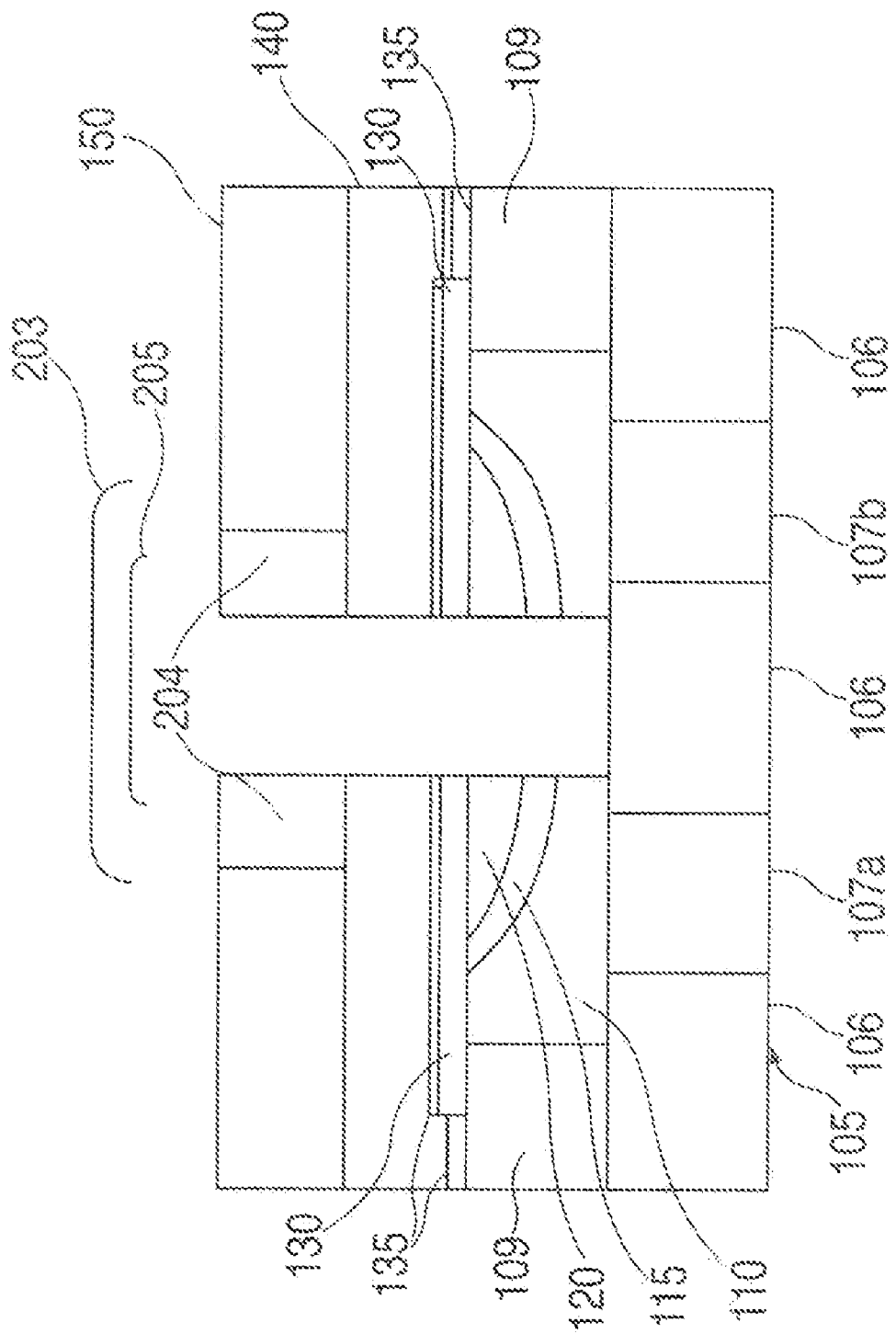
FIG. 9 illustrates an intermediate structure during the fabrication process of FIG. 2 in accordance with exemplary embodiments.

Continuing with step 240, an etch is performed that cuts through insulating layer 140, protective layer 135, high resistance phase change layer 130, low resistance phase-change layers 110, 120, insulating layer 115. In general, the etch either terminates on or shortly after reaching the underlying dielectric (bottom contact layer 105) separating the metallic electrodes 107. It is appreciated that this step can be a three-step etch, that first cuts down through the insulating layer 140 defined within via 205, stopping on the protective (SiN) layer 135 deposited at step 225. The next etch can then cut through the thin protective layer 135 (which would also slightly reduce the thickness of the overlying SiN top layer 150, unless appropriately masked by another step, or if a different material is selected). A final etch can then cut through the underlying phase-change layers (layers 110, 120, 130) and oxide insulating layer 115 until all phase-change material is removed and the underlying dielectric (bottom contact layer 105) is reached. The presence of layer 135 allows this three-step procedure, which may be useful in keeping the deep etch needed to electrically separate layers 107a and 107b from affecting the junction region 135. Regardless of the etch preference, FIG. 9 illustrates an intermediate structure in accordance with step 240, in which the defined via 205 has allows an etch to progress to bottom contact 105. FIG. 9 illustrates that the two low resistance phase change region are isolated and defined.

Figure 10:
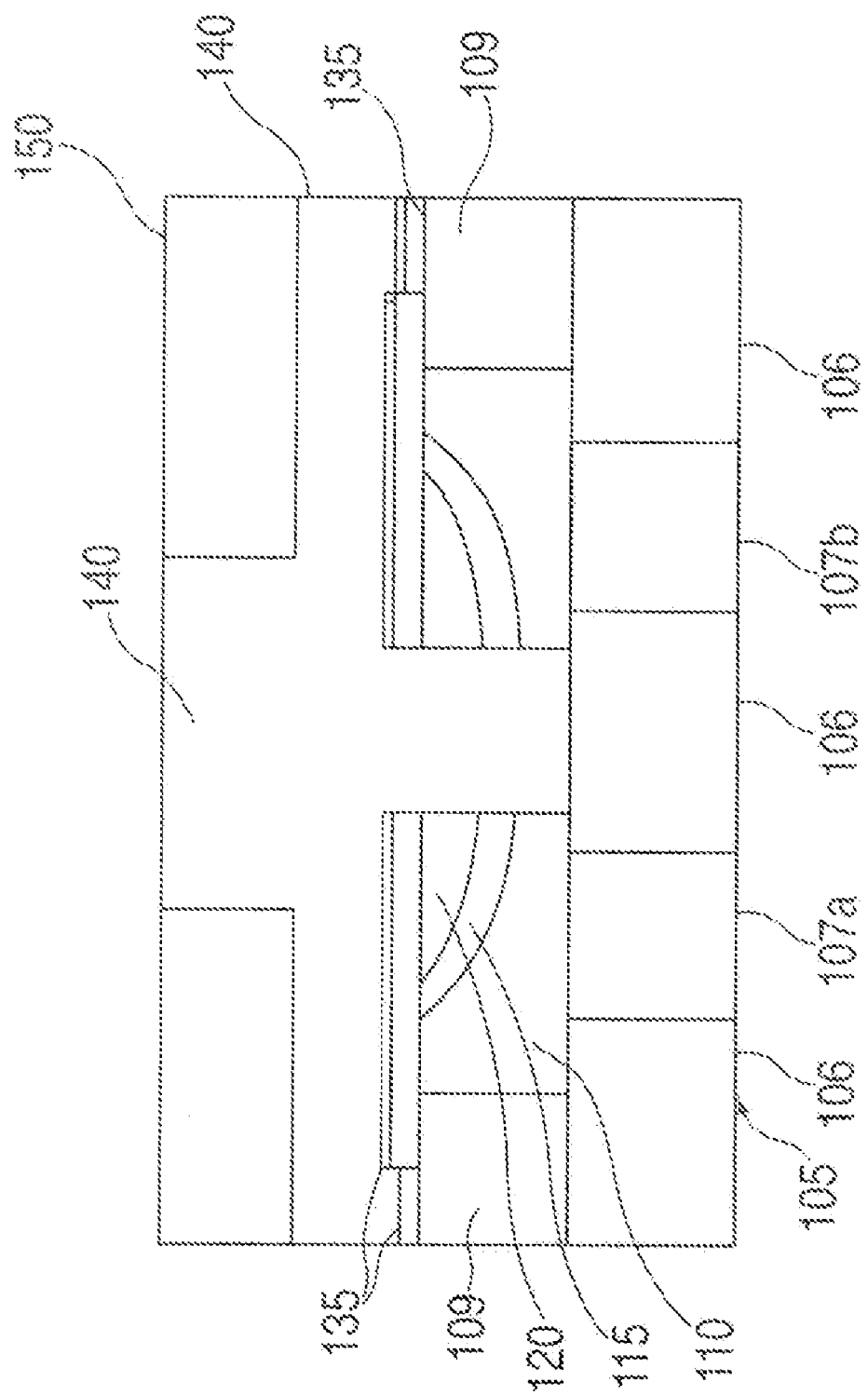
FIG. 10 illustrates an intermediate structure during the fabrication process of FIG. 2 in accordance with exemplary embodiments.
Figure 11:
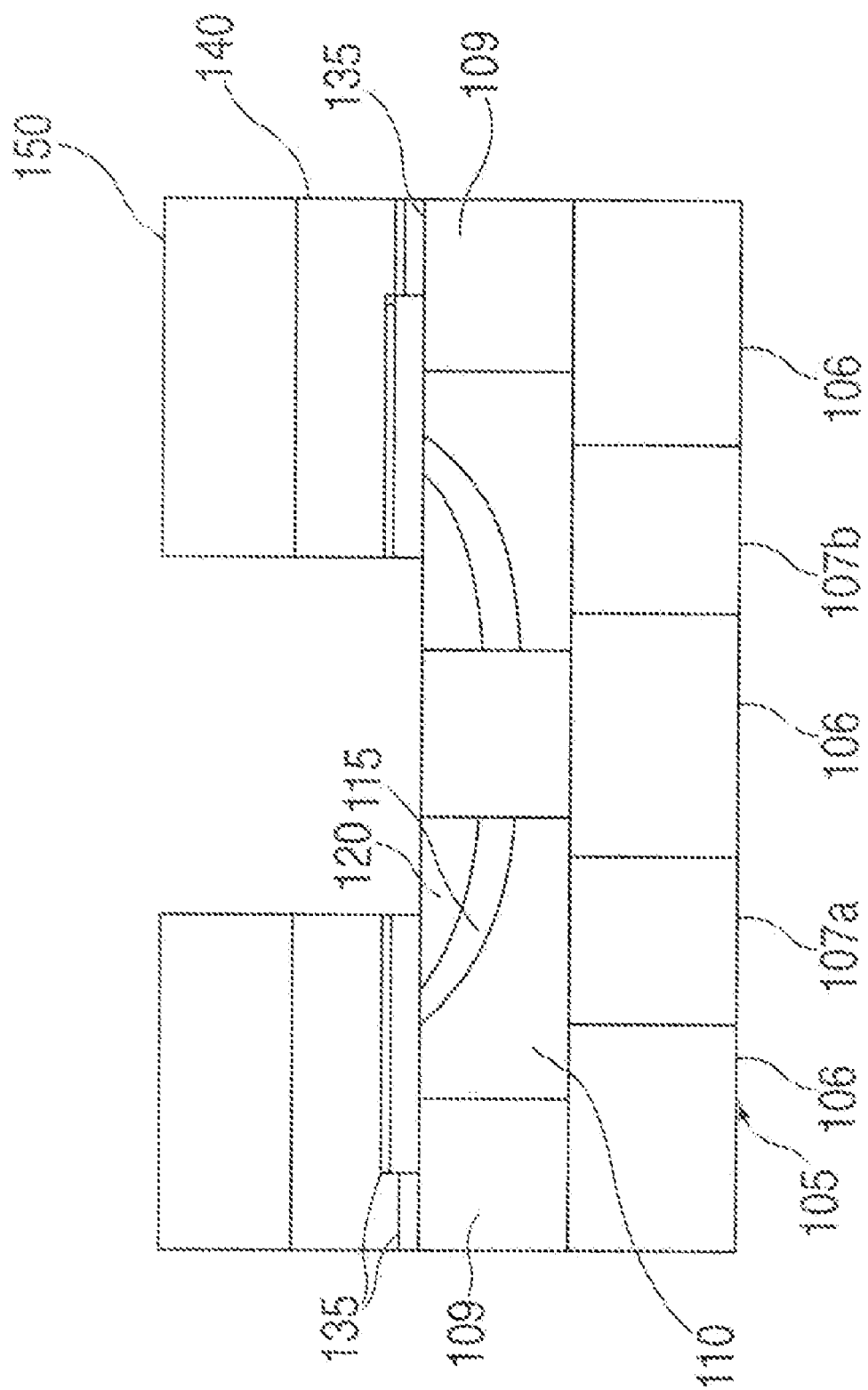
FIG. 11 illustrates an intermediate structure during the fabrication process of FIG. 2 in accordance with exemplary embodiments.

At step 245, the spacers 204 are removed. Furthermore, an insulating material is filled into the vias 203, 205 defined previously in step 240. Since the material can be the same as insulating layer 140, an insulating region 140 is defined. FIG. 10 illustrates an intermediate structure in accordance with step 245 of process 200. FIG. 10 illustrates insulating region 140. Continuing with step 245, the layer 140 can be re-planarized with top layer 150.

At step 250, via 203 can be re-etched through to the second low resistance phase change layer 120. FIG. 1I illustrates an intermediate structure in accordance with step 250 of process 200.

At step 255, the etched via 203 is filled with a metallic material such as Titanium Nitride (TiN) or Tungsten (W). In an alternative formulation, the masking for the electrical isolation etch and the top electrical contact definition can be done separately. Reference is made again to FIG. 1 that illustrates the resulting PCB 100 in accordance with process 200.

The remainder of the back-end process, including steps such as connecting metal bit-lines to these metallic vias and completing the peripheral circuits, are in accordance with processes known in the art of phase-change memory arrays.

In general, it is appreciated that the above-discussed process 200 avoids issues of using a spacer etch to attain a thin oxide layer 115 relative to the low resistance phase change regions. The stacked layer defined by layers 110, 115, 120 results in an effective PCB electrode. The current path 155 defined through the effective electrodes have a high electrical conductivity and low thermal conductivity. As such, a lower RESET power can be attained.

The flow diagram depicted herein is an example. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A phase change bridge fabrication method, comprising:
   depositing in sequential order 1) a first layer of phase change material over a bottom contact layer having at least one bottom electrical contact, 2) an insulating layer over the first layer of phase change material, and 3) a second layer of phase change material over the insulating layer that separates the first and second layers of phase change materials, the first phase change material having a resistance and the second phase change material having a resistance;
   forming a surface including a portion of the first and second layers of phase change material and a portion of the insulating layer;
   depositing a third layer of phase change material over the portions of the first and second layers of phase change material and the portion of the insulating layer, thereby defining a current path from the first layer of phase change material to the third layer of phase change material and to the second layer of phase change material, the third layer of phase change material having a resistance greater than the resistance of the first and second phase change materials; and
   forming a top electrical contact over said surface electrically coupling to the second phase change material layer.

2. The method as claimed in claim 1 wherein the third phase change material electrically couples the first and second phase change materials.

3. The method as claimed in claim 1 further comprising defining a first dielectric material on the bottom contact thereby forming a first phase change region and a second phase change region.

4. The method as claimed in claim 1 further comprising forming a dielectric layer on the third phase change material layer and adjacent the top electrical contact.

5. The method as claimed in claim 4 further comprising forming a top layer on the dielectric layer and adjacent the top electrical contact.

6. The method as claimed in claim 1 wherein said depositing in sequential order step, comprises:
   forming a layer on the bottom contact;
   defining a via in the layer; and
   conformally depositing the first layer of phase change material, the insulating layer and the second layer of phase change material.

7. The method as claimed in claim 1 wherein said forming a surface step, comprises planarizing the deposited layers of the first and second phase change material, and the insulating material by chemically-mechanically polishing the three layers' so that the surface has adjacent areas of phase change material layer, insulating material, and phase change material layer.

8. The method as claimed in claim 7 wherein the top electrical contact is formed in a via to the second phase change material layer, such that a current path is defined from the bottom contact layer up to the first phase change material layer, across the third phase change material layer, over the insulating layer, down to second phase change material layer and up through the top electrical contact.

* * * * *